United States Patent
Yamashita

(10) Patent No.: US 8,421,151 B2
(45) Date of Patent: Apr. 16, 2013

(54) SEMICONDUCTOR DEVICE AND PROCESS FOR PRODUCTION THEREOF

(75) Inventor: Kenya Yamashita, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/387,951

(22) PCT Filed: Oct. 19, 2010

(86) PCT No.: PCT/JP2010/006204
§ 371 (c)(1),
(2), (4) Date: Jan. 30, 2012

(87) PCT Pub. No.: WO2011/048804
PCT Pub. Date: Apr. 28, 2011

(65) Prior Publication Data
US 2012/0205739 A1 Aug. 16, 2012

(30) Foreign Application Priority Data

Oct. 22, 2009 (JP) .................................. 2009-243615

(51) Int. Cl.
*H01L 29/66* (2006.01)
*H01L 21/04* (2006.01)

(52) U.S. Cl.
USPC .......................................... 257/335; 438/510

(58) Field of Classification Search .................. 257/335, 257/E21.046, E29.256; 438/510
See application file for complete search history.

(56) References Cited

U.S. PATENT DOCUMENTS

| 5,218,220 A | 6/1993 | Neilson et al. |
| 8,299,494 B2 * | 10/2012 | Yilmaz et al. ................. 257/139 |
| 2005/0077569 A1 | 4/2005 | Yamashita et al. |
| 2009/0218621 A1 * | 9/2009 | Pfirsch et al. ................. 257/342 |
| 2010/0109078 A1 | 5/2010 | Stefanov et al. |
| 2010/0219417 A1 | 9/2010 | Miura et al. |

FOREIGN PATENT DOCUMENTS

| JP | 06-504882 T | 6/1994 |
| JP | 08-264766 A | 10/1996 |

(Continued)

OTHER PUBLICATIONS

International Search Report for corresponding International Application No. PCT/JP2010/006204 mailed Jan. 25, 2011.

(Continued)

*Primary Examiner* — Fernando L Toledo
*Assistant Examiner* — Neil Prasad
(74) *Attorney, Agent, or Firm* — Renner, Otto, Boisselle & Sklar, LLP

(57) ABSTRACT

The semiconductor device of this invention has unit cells, each of which includes: a substrate; a drift layer on the substrate; a body region in the drift layer; a first doped region of a first conductivity type in the body region; a second doped region of the first conductivity type arranged adjacent to the body region and in a surface region of the drift layer; a third doped region of the first conductivity type arranged between two adjacent unit cells' second doped region of the first conductivity type and in the surface region of the drift layer to contact with the second doped region of the first conductivity type; a gate insulating film arranged to contact with the surface of the drift layer at least between the first and second doped regions of the first conductivity type; a gate electrode on the gate insulating film; and first and second ohmic electrodes. The dopant concentration of the third doped region of the first conductivity type is lower than that of the second doped region of the first conductivity type and equal to or higher than that of the drift layer.

14 Claims, 8 Drawing Sheets

FOREIGN PATENT DOCUMENTS

| | | |
|---|---|---|
| JP | 2002-270837 A | 9/2002 |
| JP | 2002-270839 A | 9/2002 |
| JP | 2004-039744 A | 2/2004 |
| JP | 2004-335917 A | 11/2004 |
| JP | 2005-005578 A | 1/2005 |
| JP | 2005-136386 A | 5/2005 |
| JP | 2006-303323 A | 11/2006 |
| JP | 2007-005398 A | 1/2007 |
| JP | 2007-184434 A | 7/2007 |
| WO | 2007/091360 A1 | 8/2007 |
| WO | 2008/081225 A1 | 7/2008 |

OTHER PUBLICATIONS

International Preliminary Report on Patentability for corresponding International Application No. PCT/JP2010/006204 dated Aug. 30, 2011.

* cited by examiner (a)

(b)

(c)

US 8,421,151 B2

SEMICONDUCTOR DEVICE AND PROCESS FOR PRODUCTION THEREOF

TECHNICAL FIELD

The present invention relates to a semiconductor device and more particularly relates to a silicon carbide semiconductor device and a method for fabricating the device.

BACKGROUND ART

A wide-bandgap semiconductor has attracted a lot of attention as a semiconductor material that could be potentially used to make a semiconductor device that has a high breakdown voltage and that can make a huge amount of current flow through it (i.e., a so-called "power device"). Among other things, silicon carbide (SiC) has a much higher dielectric breakdown voltage than any other wide-bandgap semiconductor, and therefore, is expected to be the best semiconductor material to make a next-generation low-loss power device. As a quality silicon dioxide ($SiO_2$) film can be formed on SiC by thermal oxidation, an insulated gate SiC power MISFET (metal-insulator-semiconductor field effect transistor) that uses such a silicon dioxide film as its gate insulating film is currently under development.

However, as such a SiC-MOS structure has a very high density of interfacial levels at the $SiO_2$/SiC interface, its channel mobility is low, its channel resistance will be high when it is implemented as a SiC power MISFET, and therefore, the low loss property that SiC has by nature cannot be make full use of, which is a problem.

Thus, to overcome such a problem, Patent Document No. 1 discloses a vertical SiC power MISFET with the structure shown in FIG. 9. As shown in FIG. 9, the SiC power MISFET includes a SiC semiconductor substrate 2 and an n-type drift layer 3, which is arranged on the SiC substrate 2. A p-body region 4a has been defined in the drift layer 3. Inside the body region 4a, further defined are an n-type source region 5 and a p-type contact region 4b. An n-type doped region 27 is defined in a surface region so as to extend from the source region 5 through the body region 4a and also extend from the body region 4a through the drift layer 3. The source region 5 and the contact region 4b make ohmic contact with an ohmic electrode 6 arranged on the surface of the drift layer 3.

In the FET illustrated in FIG. 9, the channel is defined as the region between the two n-type doped regions 27. By adopting such a structure, a channel length of 1 μm or less can be achieved. As a result, even if the channel mobility is low due to a high density of those interfacial levels, the channel resistance can still be reduced.

On the other hand, the gate insulating film of a SiC power MISFET should have sufficiently high reliability in OFF state. When a high voltage is applied to the drain electrode of a SiC power MISFET in OFF state, a high electric field is applied to a portion of the gate insulating film that is located over the gap between the body regions. Particularly, an electric field with the maximum intensity is applied to a portion of the gate insulating film that is located at the intermediate point R over the gap between the body regions 4a shown in FIG. 9. That is why the intensity of the electric field to apply should be determined so as not to cause a breakdown in the gate insulating film at the point R. This is because if a breakdown happened in the gate insulating film, the power circuit would be affected seriously.

Thus, to overcome such a problem, Patent Document No. 2 discloses a technique for reducing the channel resistance by providing an accumulated channel (i.e., an n-type channel region 28) in an upper portion of each p-type body region 4a as shown in FIG. 10. According to Patent Document No. 2, by providing no n-type heavily doped region in a surface region of the drift layer 3 between the body regions 4a, it is possible to prevent the intensity of the electric field from being excessively high at the point R.

CITATION LIST

Patent Literature

Patent Document No. 1: Japanese Patent Application Laid-Open Publication No. 2006-303323
Patent Document No. 2: Japanese Patent Application Laid-Open Publication No. 2004-335917

SUMMARY OF INVENTION

Technical Problem

However, the present inventors discovered via experiments that if such an n-type doped region with a high dopant concentration was provided in a surface region of the drift layer 3 as shown in FIG. 9, then (1) the amount of drain leakage current to flow in OFF state increased, (2) the breakdown voltage decreased in OFF state, (3) a breakdown happened in, or leakage current flowed through, the gate insulating film due to a high drain electric field in OFF state, and (4) the threshold voltage decreased.

Specifically, in the structure shown in FIG. 9, the concentration of the n-type doped region 27 is set to be approximately equal to or higher than the concentration of a surface portion of the body region 4a that is located right under the n-type doped region 27. This is a constraint to be imposed by having to define the n-type doped region by counter-doping the surface portion of the p-type body region 4a with an n-type dopant. As a typical example, if the concentration of the body region 4a is set to be $10^{17}$ cm$^{-3}$, then the concentration of the n-type doped region 27 should be set to be at least equal to, and preferably higher than, $10^{17}$ cm$^{-3}$, which is higher than the concentration of the drift layer 3 by one digit or more.

In a situation where the n-type doped region 27 with such a high concentration is provided in a portion of the drift layer 3 between the body regions 4a, when a high voltage is applied to the ohmic electrode 1, an electric field with a high intensity will be applied in excess to the n-type doped region 27. As a result, an avalanche breakdown will happen. Or particularly in a short-gate-length MISFET having a gate length of less than 1 μm, the voltage barrier of its source will have its height decreased by the drain electric field, thus causing a short channel effect easily. Consequently, the amount of drain leakage current to flow will increase or the threshold voltage Vth of the device will decrease. Also, as the electric field applied to the n-type doped region 27 increases, the intensity of the electric field applied to the gate insulating film 8a that is located right over the n-type doped region 27 also increases, thus increasing the amount of gate leakage current to flow or causing a breakdown of the gate insulating film 8a. Among other things, the intensity of the electric field concentrated excessively at the point R of the gate insulating film 8a becomes outstandingly high.

Meanwhile, if no such doped regions of the first conductivity type are provided in a portion of the drift layer 3 between the body regions 4a as in the MISFET structure disclosed in Patent Document No. 2 and shown in FIG. 10, the overconcentration of the electric field toward the point R can be lessened.

Nevertheless, since the body region 4a has a higher dopant concentration than the drift layer 3, a depletion layer 3d could be formed in the drift layer 3 even when the MISFET is ON. In that case, as indicated by the arrows in FIG. 10, electrons flowing through the channel region 28 are prevented by the depletion layer 3d from flowing into the drift layer 3. As a result, the channel length increases substantially, and therefore, the channel resistance increases unintentionally.

It is therefore an object of the present invention to provide a wide-bandgap semiconductor device that can have its reliability increased by reducing the channel resistance in ON state and by increasing the breakdown voltage in OFF state.

Solution to Problem

A semiconductor device according to the present invention has a plurality of unit cells that are arranged either one-dimensionally or multi-dimensionally. Each of those unit cells includes: a substrate, which is made of a wide-bandgap semiconductor of a first conductivity type; a drift layer, which is arranged on the substrate and which is made of the wide-bandgap semiconductor of the first conductivity type; a body region of a second conductivity type, which is defined in the drift layer; a first doped region of the first conductivity type, which is defined in the body region of the second conductivity type; a second doped region of the first conductivity type, which is arranged adjacent to the body region of the second conductivity type and defined in a surface region of the drift layer; a third doped region of the first conductivity type, which is arranged between the second doped region of the first conductivity type and an adjacent unit cell's second doped region of the first conductivity type and defined in the surface region of the drift layer so as to be in contact with the second doped region of the first conductivity type; a gate insulating film, which is arranged so as to contact with the surface of the drift layer at least between the first and second doped regions of the first conductivity type; a gate electrode, which is arranged on the gate insulating film; a first ohmic electrode, which is electrically connected to the first doped region of the first conductivity type; and a second ohmic electrode, which is electrically connected to the other surface of the substrate that is opposite to its surface with the drift layer. The dopant concentration of the third doped region of the first conductivity type is lower than that of the second doped region of the first conductivity type and equal to or higher than that of the drift layer.

In one preferred embodiment, the semiconductor device further includes a channel region of the first conductivity type, which is arranged in a surface region of the body region so as to reach both of the first doped region of the first conductivity type and the drift layer and to contact with the gate insulating film. The dopant concentration of the channel region is between the respective dopant concentrations of the first and second doped regions of the first conductivity type.

In this particular preferred embodiment, the thickness of the second doped region of the first conductivity type is equal to or smaller than that of the channel region.

In another preferred embodiment, when each of the unit cells is viewed from over the surface of the drift layer, the width of the second doped region of the first conductivity type as measured in a direction in which the unit cells are arranged is at least roughly large enough to deplete the second doped region of the first conductivity type from the body region.

In this particular preferred embodiment, the semiconductor device further includes a fourth doped region of the first conductivity type, which is defined in the drift layer adjacent to the third doped region of the first conductivity type and includes a vertex of the unit cell when viewed from over the surface of the drift layer. The dopant concentration of the fourth doped region of the first conductivity type is lower than that of the second doped region of the first conductivity type.

In another preferred embodiment, when each of the unit cells is viewed from over the surface of the drift layer, the body region has a square shape and the second doped region of the first conductivity type is not provided at any of the four corners of the body region.

In still another preferred embodiment, when each of the unit cells is viewed from over the surface of the drift layer, the second doped region of the first conductivity type surrounds the body region continuously.

In yet another preferred embodiment, the dopant concentration of the second doped region of the first conductivity type is higher than that of the body region.

In a specific preferred embodiment, the second doped region of the first conductivity type has a dopant concentration of $1 \times 10^{16}$ cm$^{-3}$ to $1 \times 10^{19}$ cm$^{-3}$.

In another specific preferred embodiment, the second doped region of the first conductivity type has a dopant concentration of $1 \times 10^{16}$ cm$^{-3}$ to $1 \times 10^{18}$ cm$^{-3}$.

In still another specific preferred embodiment, the second doped region of the first conductivity type has a dopant concentration of $1 \times 10^{16}$ cm$^{-3}$ to $1 \times 10^{17}$ cm$^{-3}$.

In yet another specific preferred embodiment, the second doped region of the first conductivity type has a width of 0.01 µm to 0.1 µm and has a dopant concentration of $1 \times 10^{17}$ cm$^{-3}$ to $1 \times 10^{18}$ cm$^{-3}$.

A method for fabricating a semiconductor device according to the present invention includes the steps of: (A) providing a substrate of a wide-bandgap semiconductor of a first conductivity type, in which a drift layer of the wide-bandgap semiconductor of the first conductivity type has been defined; (B) making a body region mask on the drift layer; (C) implanting a dopant of a second conductivity type through the body region mask, thereby defining a body region of the second conductivity type in the drift layer; (D) implanting a dopant of the first conductivity type both in a perpendicular direction to the substrate and in a direction oblique to the perpendicular direction through the body region mask, thereby defining a doped region, including a channel region, in the drift layer and also defining a second doped region of the first conductivity type in a portion of the drift layer under the body region mask; (E) making another mask to define a first doped region of the first conductivity type on the drift layer, said another mask being self-aligned with the body region mask; (F) implanting a dopant of the first conductivity type through said another mask, thereby defining not only the first doped region of the first conductivity type in the drift layer and defining the channel region; (G) removing the body region mask and said another mask; (H) subjecting the drift layer to an activating annealing process; (I) forming a gate insulating film on the surface of the first and second doped regions of the first conductivity type; (J) forming a gate electrode on the gate insulating film; and (K) forming an ohmic electrode that contacts with the first doped region of the first conductivity type and another ohmic electrode that contacts with the other surface of the substrate opposite to its surface with the drift layer.

In one preferred embodiment, the step (D) includes the steps of implanting the dopant of the first conductivity type into the drift layer from a direction that defines a predetermined tilt angle with respect to a normal to the surface of the substrate on each of multiple planes that intersect at right angles with multiple sides that define an opening of the body region mask, thereby defining the second doped region of the first conductivity type in that portion of the drift layer under the body region mask, and implanting the dopant of the first conductivity type perpendicularly to the substrate, thereby defining the doped region, including the channel region, in the drift layer.

In another preferred embodiment, the step (D) includes the steps of implanting the dopant of the first conductivity type into the drift layer from a direction that defines a predetermined tilt angle with respect to a normal to the surface of the substrate while rotating the substrate continuously on an axis that intersects with the substrate at right angles, thereby defining the second doped region of the first conductivity type in that portion of the drift layer under the body region mask, and implanting the dopant of the first conductivity type perpendicularly to the substrate, thereby defining the doped region, including the channel region, in the drift layer.

ADVANTAGEOUS EFFECTS OF INVENTION

According to the present invention, since a second doped region of the first conductivity type is provided, carriers supplied from the second doped region of the first conductivity type can prevent a depletion layer, which is formed in a drift layer through a contact with a body region, from expanding. Thus, the increase in channel length can be minimized and electrons can flow into the drift layer through the second doped region of the first conductivity type. As a result, the channel resistance can be reduced effectively.

In addition, since a third doped region of the first conductivity type is further provided, the overconcentration of an electric field toward the gate insulating film at a middle point between the body regions, which would otherwise be caused by the voltage applied to the second ohmic electrode when the semiconductor device is OFF state, can be lessened. Consequently, the breakdown voltage and the reliability can be both increased.

DESCRIPTION OF EMBODIMENTS

Hereinafter, preferred embodiments of a semiconductor device according to the present invention will be described. In this description, a "wide-bandgap semiconductor" refers herein to a semiconductor such as SiC or GaN. Also, in the following description of preferred embodiments, a double-implanted MISFET, which uses n-type as the first conductivity type and p-type as the second conductivity type, respectively, will be described as a semiconductor device according to the present invention. However, the present invention is also applicable effectively to a semiconductor device that uses p-type as the first conductivity type and n-type as the second conductivity type, respectively. For example, the present invention can also be used effectively in an insulated gate bipolar transistor (IGBT).

(Embodiment 1)

Figure 1:
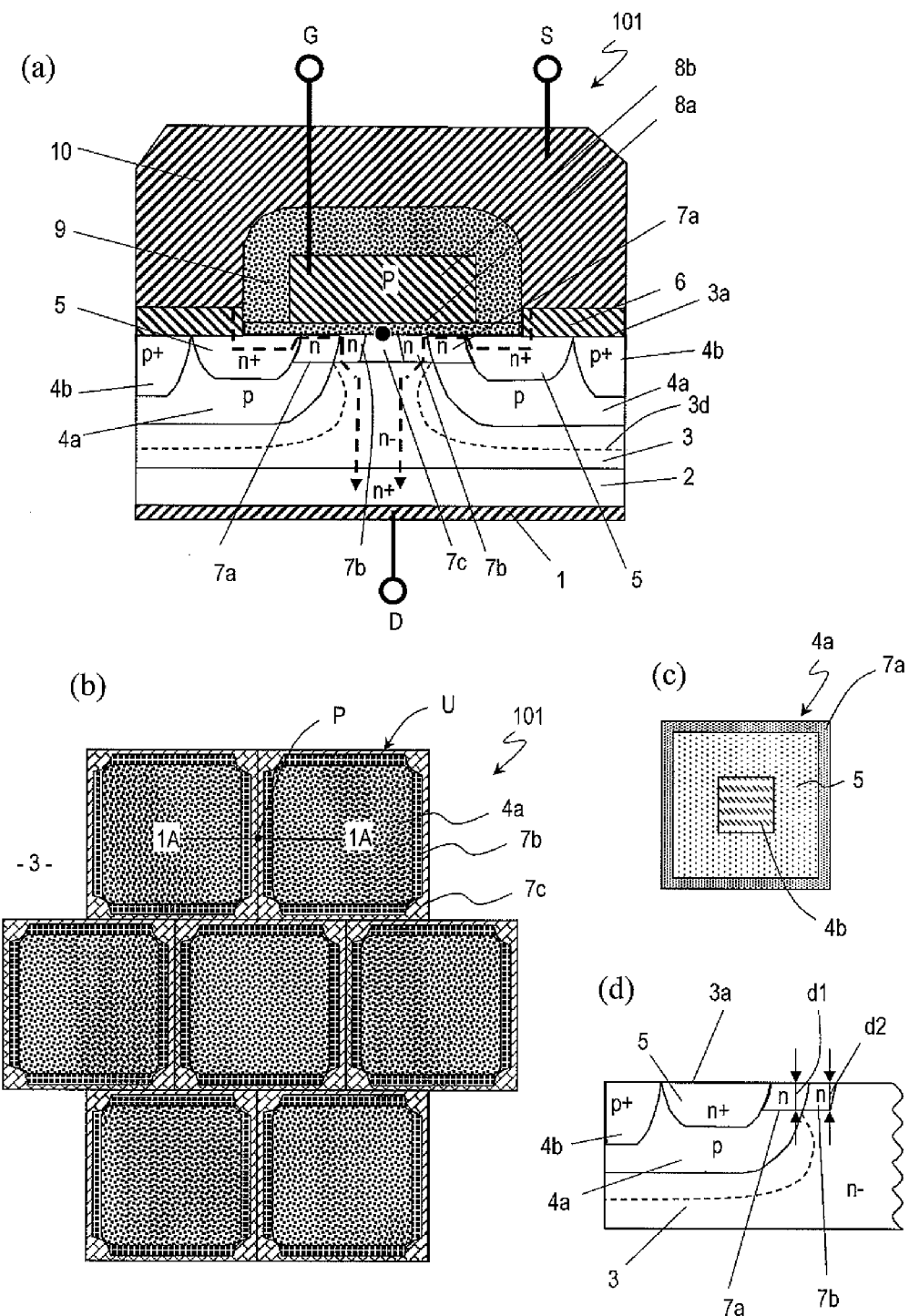
FIG. 1 illustrates a first specific preferred embodiment of a semiconductor device according to the present invention, wherein FIG. 1(*a*) is a cross-sectional view thereof, FIG. 1(*b*) is a plan view illustrating the arrangement and structure of unit cells in a drift layer, and FIGS. 1(*c*) and 1(*d*) are respectively a plan view and a cross-sectional view illustrating the structure in the body region.

Hereinafter, a first preferred embodiment of a semiconductor device according to the present invention will be described. FIG. 1(*a*) illustrates a cross-sectional structure of a portion of a double-implanted MISFET 101 and FIG. 1(*b*) is a plan view of the drift layer 3 of the MISFET 101. The cross section shown in FIG. 1(*a*) is viewed on the plane 1A-1A shown in FIG. 1(*b*). The MISFET 101 includes a number of unit cells. As shown in FIG. 1(*b*), a plurality of unit cells U, each of which has a square shape, for example, are arranged in a hound's tooth check pattern on the drift layer 3. More specifically, the unit cells U are arranged two-dimensionally and an arrangement of unit cells U in one direction is shifted by a half pitch from an adjacent arrangement of unit cells U in the same direction. However, since the effect of the present invention can be achieved as long as the unit cells U are arranged adjacent to each other in the MISFET 101 as will be described later, the unit cells U may be arranged at least one-dimensionally. Also, as viewed from over the surface of the drift layer 3, the unit cells U do not have to have a square shape but may also have a triangular, hexagonal or any other polygonal shape or even a combination of multiple polygonal shapes. Even so, the same effect can also be achieved. It should be noted, however, that such a triangular, square, hexagonal or any other polygonal shape or a combination of multiple polygonal shapes includes herein such a shape with rounded corners.

Each unit cell U of the MISFET 101 includes a substrate 2, which is made of a wide-bandgap semiconductor, and a drift layer 3, which is made of the wide-bandgap semiconductor and arranged on the substrate 2. In this preferred embodiment, the substrate 2 is a SiC substrate with low resistivity, which may be doped with a dopant of a first conductivity type (such as nitrogen, phosphorus, or arsenic) at a dose of $1 \times 10^{18}$ cm$^{-3}$ or more. On the other hand, the drift layer 3 is a SiC semiconductor layer doped with a dopant of the first conductivity type (such as nitrogen) at a dose of about $1 \times 10^{14}$ cm$^{-3}$ to about $1 \times 10^{16}$ cm$^{-3}$. The drift layer 3 may be epitaxially grown on the substrate 2 by CVD process, for example.

A body region 4*a* of a second conductivity type has been defined in a part of the drift layer 3 so as to spread inward from its surface $3a$ (i.e., go deeper into the substrate). The body region $4a$ may be doped with a dopant of a second conductivity type at a dose of $1\times10^{16}$ cm$^{-3}$ to of $1\times10^{18}$ cm$^{-3}$, for example. To achieve a high breakdown voltage, the body region $4a$ preferably has a dopant concentration of $1\times10^{17}$ cm$^{-3}$ to $1\times10^{19}$ cm$^{-3}$.

In addition, a contact region $4b$, which is heavily doped with a dopant of the second conductivity type, and a first doped region $5$ of the first conductivity type have also been defined adjacent to each other in a portion of the body region $4a$ so as to spread inward from the surface of the body region $4a$. The contact region $4b$ is doped with a dopant of the second conductivity type at a dose of approximately $5\times10^{19}$ cm$^{-3}$ and the first doped region $5$ of the first conductivity type is doped with a dopant of the first conductivity type at a dose of $1\times10^{19}$ cm$^{-3}$ to $1\times10^{20}$ cm$^{-3}$.

A channel region $7a$ is provided in a surface region of the body region $4a$ so as to cover the first doped region $5$ of the first conductivity type and the drift layer $3$. The channel region $7a$ is exposed on the surface $3a$ of the drift layer $3$. The dopant concentration of the channel region $7a$ is preferably between those of the first and second doped regions $5$ and $7b$ of the first conductivity type. Specifically, if the dopant concentration of the body region $4a$ is about $1\times10^{17}$ cm$^{-3}$, which is a typical value, the threshold voltage can be controlled to an appropriate value of about 4 V by adjusting the dopant concentration of the second doped region $7a$ to about $1.5\times10^{17}$ cm$^{-3}$. On the other hand, if the dopant concentration of the body region $4a$ is about $1\times10^{19}$ cm$^{-3}$, the threshold voltage can be controlled to about 4 V by adjusting the dopant concentration of the second doped region $7a$ to about $5\times10^{18}$ cm$^{-3}$. In this manner, by adjusting the dopant concentration of the second doped region $7a$ within the range $5\times10^{16}$ cm$^{-3}$ to $1\times10^{19}$ cm$^{-3}$ with the dopant concentration range of the body region $4a$ taken into account, the threshold voltage can be controlled to about 4 V. Also, even if the threshold voltage should be controlled to a value that is somewhat lower or higher than 4 V, any desired threshold value can be achieved by adjusting the dopant concentration of the channel region $7a$ within this range.

Also, the second dopant concentration of the channel region $7a$ may be set to be lower than that of the body region $4a$. In that case, the threshold value of the transistor needs to be adjusted according to the dopant concentration in a surface region of the body region $4a$. Alternatively, instead of providing the channel region $7a$, an inversion layer to be formed in a surface region of the body region $4a$, which is exposed on the surface $3a$ of the drift layer $3$, when a gate voltage is applied may also be used as a channel.

Also, the channel region $7a$ preferably has a sheet concentration of $10^{12}$ cm$^{-2}$. In this manner, the first doped region $5$ of the first conductivity type, the contact region $4b$ and the channel region $7a$ are defined in the body region $4a$. FIG. $1(c)$ is a plan view illustrating the structure of the body region $4a$ as viewed from over the surface of the drift layer $3$. The contact region $4b$ is surrounded with the first doped region $5$ of the first conductivity type, which is further surrounded with the channel region $7a$.

As shown in FIG. $1(a)$, a second doped region $7b$ of the first conductivity type is provided in a surface region of the drift layer $3$ so as to be adjacent to the channel region $7a$. It is preferred that the second doped region $7b$ of the first conductivity type have a higher dopant concentration than the drift layer $3$. The dopant concentration of the second doped region $7b$ of the first conductivity type is not compensated for by the dopant in the body region $4a$. That is why by setting the dopant concentration of the second doped region $7b$ of the first conductivity type to be within the range of $5\times10^{16}$ cm$^{-3}$ to $5\times10^{17}$ cm$^{-3}$, which is almost as high as that of the body region $4a$, the channel resistance can be reduced effectively. If the dopant concentration of the second doped region $7b$ of the first conductivity type is set to be an even higher value (e.g., approximately $1\times10^{18}$ cm$^{-3}$), then the channel resistance can be further reduced effectively. In that case, however, the electric field would be overconcentrated in the second doped region $7b$ of the first conductivity type, thus possibly causing a gate leakage current or a breakdown in the gate insulating film.

Furthermore, even if the dopant concentration of the second doped region is set to be lower than that of the body region $4a$, the channel resistance can still be reduced to a half by setting the concentration of the second doped region $7b$ of the first conductivity type to be within the range of about $1\times10^{16}$ cm$^{-3}$ to about $1\times10^{17}$ cm$^{-3}$. This feature will be described in detail later in the following description of preferred embodiments.

As shown in FIG. $1(d)$, the thickness d2 of the second doped region $7b$ of the first conductivity type (as measured from the surface $3a$) is preferably equal to or smaller than the thickness d1 of the channel region $7a$.

Each unit cell U further has a third doped region $7c$ of the first conductivity type, which is arranged between its own second doped region $7b$ of the first conductivity type and an adjacent unit cell's U and in a surface region of the drift layer $3$. The dopant concentration of the third doped region $7c$ of the first conductivity type is preferably lower than that of the second doped region $7b$ of the first conductivity type and equal to or higher than that of the drift layer $3$.

As shown in FIG. $1(b)$, the second doped region $7b$ of the first conductivity type surrounds the body region $4a$ except its four corners. In other words, the second doped region $7b$ of the first conductivity type is not provided at any of the four corners of the body region $4a$.

A gate insulating film $8a$ is arranged in contact with the surface $3a$ of the drift layer $3$. The gate insulating film $8a$ is preferably arranged so as to contact with at least a portion of the MISFET $101$ to be a channel region (i.e., to contact with the surface $3a$ of the drift layer $3$ between the first and second doped regions $5$ and $7b$ of the first conductivity type). If the channel region $7a$ is provided, then the gate insulating film $8a$ is arranged so as to contact with at least the channel region $7a$. On the other hand, if a channel is formed by producing an inversion layer, then the gate insulating film $8a$ is arranged so as to contact with at least the body region $4a$ that is exposed on the surface $3a$ of the drift layer $3$. In this preferred embodiment, the gate insulating film $8a$ is arranged over and in contact with the channel region $7a$ and the second and third doped regions $7b$ and $7c$ of the first conductivity type. Optionally, the gate insulating film $8a$ may also cover a portion of the first doped region $5$ of the first conductivity type as well.

Also, a gate electrode $8b$ is arranged on the gate insulating film $8a$. The gate insulating film $8a$ may be made of silicon dioxide, for example, and may be formed by either depositing and then patterning silicon dioxide or thermally oxidizing the surface of the drift layer $3$. The gate electrode $8b$ may be made of polysilicon, for example.

An ohmic electrode $6$ (which will be referred to herein as a "first ohmic electrode $6$") is arranged so as to be electrically connected to the first doped region $5$ of the first conductivity type and the contact region $4b$. The ohmic electrode $6$ will be a source electrode if the first conductivity type is n-type and will be a drain electrode if the first conductivity type is p-type. Another ohmic electrode (which will be referred to herein as a "second ohmic electrode $1$") is arranged on the other surface of the substrate 2 opposite to the drift layer 3. The ohmic electrode 1 will be a drain electrode if the first conductivity type is n-type and will be a source electrode if the first conductivity type is p-type. The ohmic electrodes 6 and 1 may be made of a Ni alloy, for example, and make ohmic contact with the first doped region 5 of the first conductivity type, the contact region 4b and the substrate 2 as a result of heat treatment.

Furthermore, an interlevel dielectric film 9 has been deposited over the gate electrode 8b and a contact hole has been cut through the interlevel dielectric film 9 to expose the ohmic electrode 6. The ohmic electrode 6 is electrically connected to a source line 10, to which also connected are the respective source electrodes 9 of other unit cells.

In each unit cell of the MISFET 101 with such a structure, if a bias voltage that is equal to or greater than a threshold voltage is applied to the gate electrode 8b while a predetermined voltage is being applied to between the ohmic electrodes 6 and 1, electrons, which are carriers, move from the ohmic electrode 6, pass through the first doped region 5 of the first conductivity type and flow around the interface between the channel region 7a and the gate insulating film 8a as indicated by the dashed arrows in FIG. 1(a).

Figure 10:
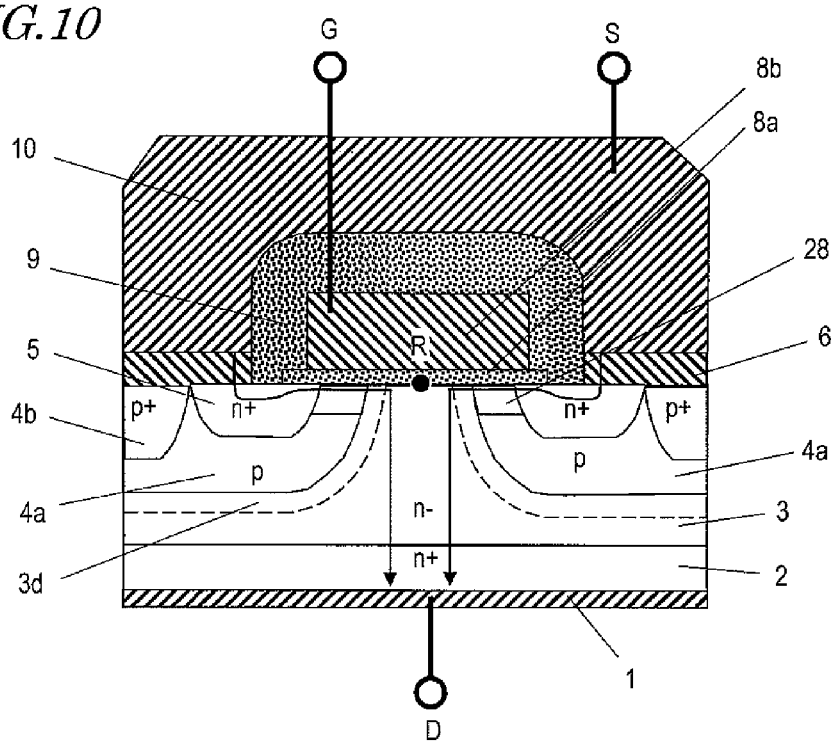
FIG. 10 is a cross-sectional view illustrating the structure of another conventional semiconductor device.

Since the second doped region 7b of the first conductivity type is provided according to this preferred embodiment, the expansion of a depletion layer 3d, which is produced in the drift layer 3 through a contact between the drift layer 3 and the body region 4a, can be reduced significantly by those carriers supplied from the second doped region 7b of the first conductivity type. As a result, the extension of the channel length can be minimized as already described with reference to FIG. 10 and the electrons can flow into the drift layer 3 through the second doped region 7b of the first conductivity type. Consequently, the channel resistance can be reduced effectively.

Each unit cell U further has the third doped region 7c of the first conductivity type, which is arranged between its own second doped region 7b of the first conductivity type and an adjacent unit cell's U and in a surface region of the drift layer 3. The third doped region 7c of the first conductivity type has a lower dopant concentration than the second doped region 7b of the first conductivity type. That is why while the MISFET 101 is OFF, depletion layers, expanding from two adjacent body regions 4a into the drift layer 3, will reach a point under the intermediate point P between the body regions 4a, and therefore, it is possible to prevent the voltage applied to the ohmic electrode 1 from being concentrated toward the point P. Consequently, overconcentration of an electric field in the third doped region 7c of the first conductivity type and increase in drain leakage current while the MISFET is OFF can be avoided, and decrease in breakdown voltage can be minimized. In addition, increase in the leakage current to flow through the gate insulating film due to a high drain electric field and a breakdown of the gate insulating film can also be minimized and decrease in threshold voltage can be checked, too. As a result, the reliability of the MISFET can be increased.

Particularly, if the thickness d2 of the second doped region 7b of the first conductivity type is equal to or smaller than the thickness d1 of the channel region 7a, then the second doped region 7b of the first conductivity type will be large enough to prevent effectively the channel length from extending too much. That is why while the MISFET 101 is OFF, the depletion layer can greatly expand from the body region 4a into the drift layer 3 more easily without being interfered with by the second doped region 7b of the first conductivity type. Consequently, the MISFET 101 can have an increased breakdown voltage in OFF state.

Furthermore, as either the channel region 7a provided in the body region 4a or an inversion layer to be formed in the body region 4a when a gate voltage is applied is used as a channel, the number of manufacturing processing steps required can be cut down and the semiconductor device can be manufactured at a reduced cost, compared to a situation where an epitaxial layer is provided as a channel. On top of that, the thickness and dopant concentration of an epitaxial layer that affect the threshold value with of a semiconductor device will depend on the growth rate and impurity intake rate during the crystal growing process by epitaxy, which are difficult to control precisely. That is why as such difficult-to-control factors can be removed by omitting an epitaxial layer, semiconductor devices with uniform and less varied characteristics can be mass-produced.

Figure 2:
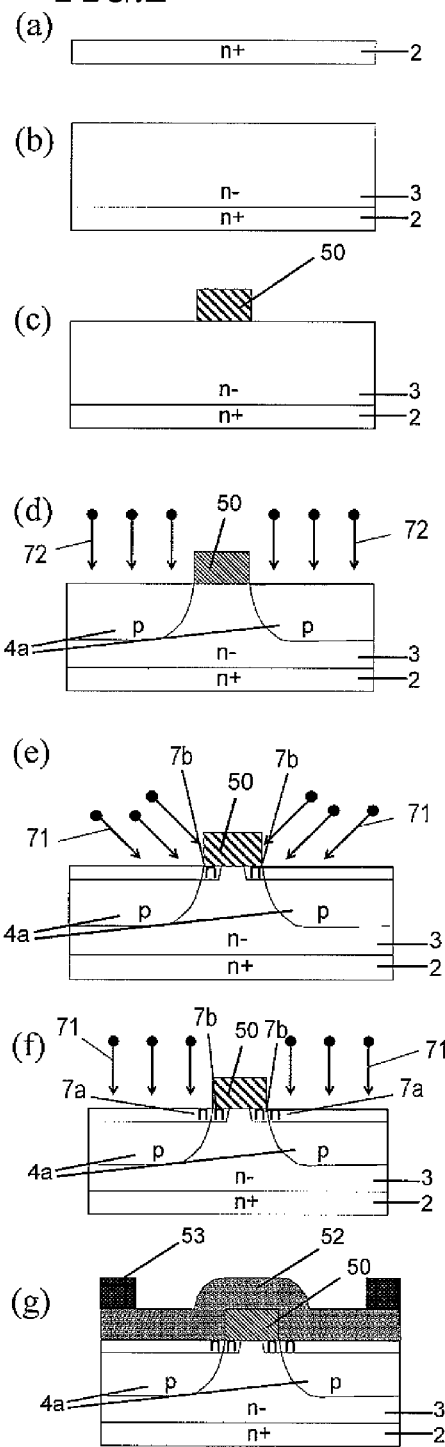
FIGS. 2(*a*) through 2(*l*) are cross-sectional views illustrating respective manufacturing processing steps to fabricate the semiconductor device shown in FIG. 1.
Figure 2:
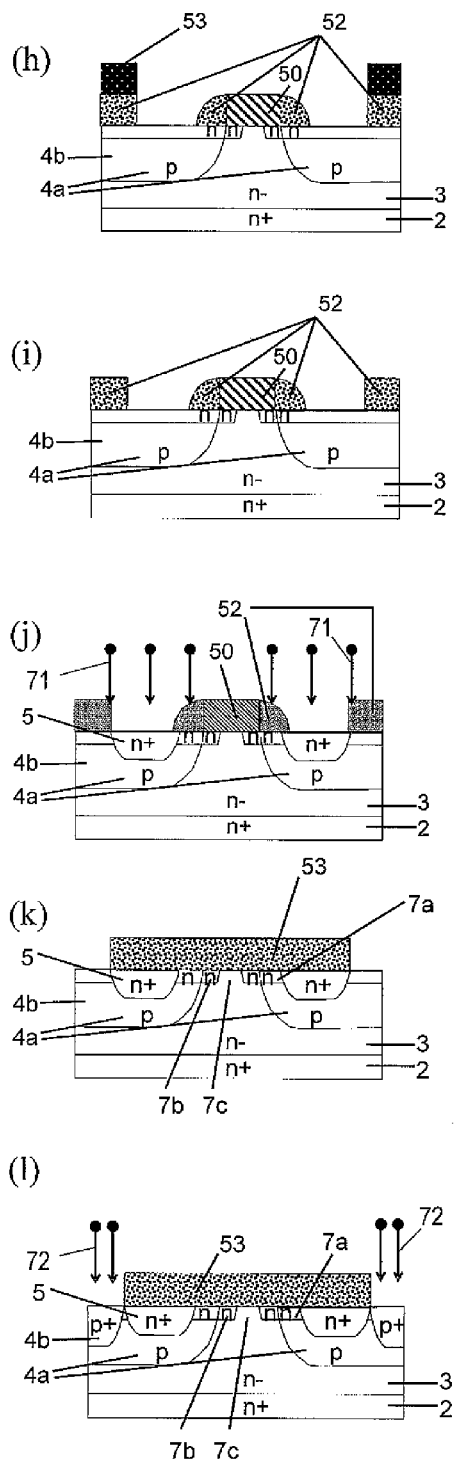

The MISFET 101 may be fabricated by performing the following process, for example. In the following example, the first conductivity type is n-type and the second conductivity type is p-type. First of all, a SiC substrate 2, which defines an off-axis angle of 8 degrees with respect to a (0001) plane of 4H—SiC, is provided as shown in FIG. 2(a). Next, as shown in FIG. 2(a), a drift layer 3, which is made of high-resistivity SiC that is more lightly doped with a dopant of the first conductivity type than the SiC substrate 2, is formed on the principal surface of the SiC substrate 2 by thermal CVD process, for example. Optionally, the SiC substrate 2 may also be a low-off-axis-angle substrate with a crystallographic plane orientation that defines an off-axis angle of less than 8 degrees. The drift layer 3 is formed by using silane ($SiH_4$) and propane ($C_3H_8$) gases as source gases, hydrogen ($H_2$) gas as a carrier gas, and nitrogen ($N_2$) gas as a dopant gas, respectively. For example, when a MISFET with a breakdown voltage of 1000 V is going to be fabricated, the high-resistivity SiC layer 3 preferably has a dopant concentration of $1\times10^{15}$ $cm^{-3}$ to $1\times10^{16}$ $cm^{-3}$ and a thickness of 10 µm or more.

Figure 3:
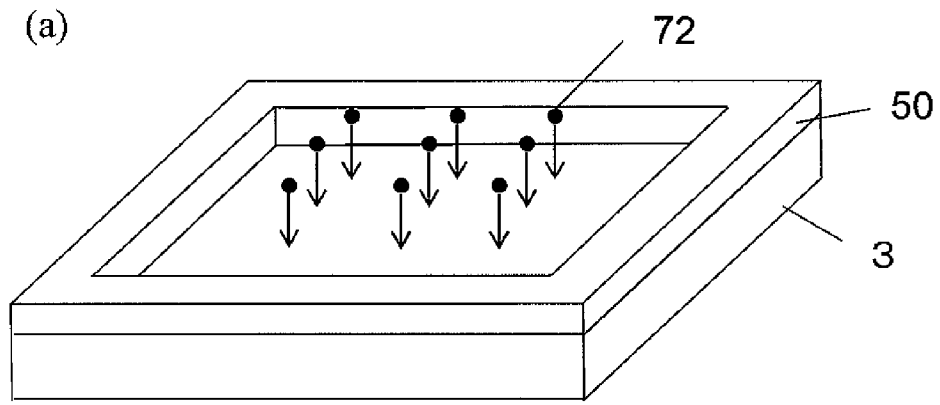
FIGS. 3(*a*) through 3(*c*) illustrate three different ion implantation processes to carry out to form a second doped region of a first conductivity type.
Figure 3:
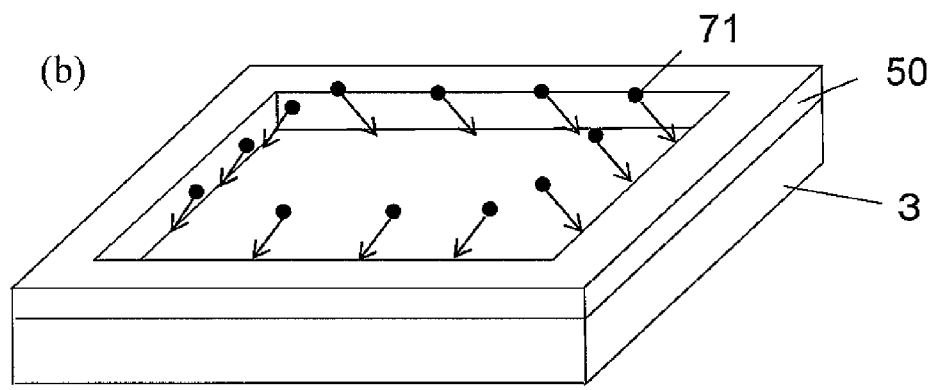
Figure 3:
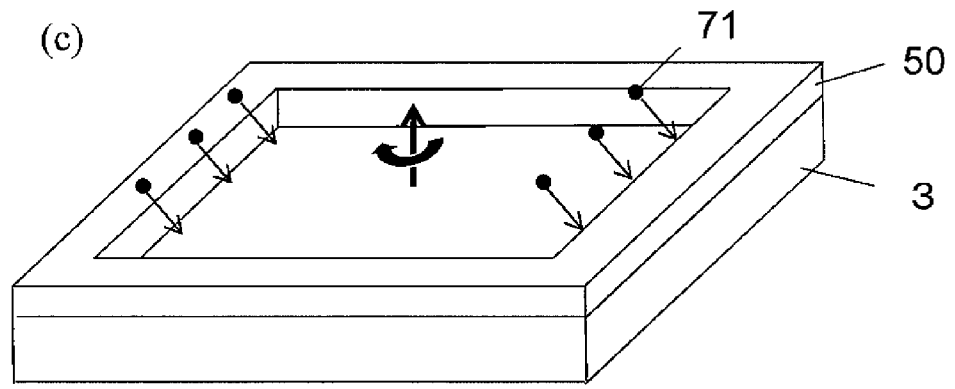

Next, as shown in FIG. 2(c), a mask 50 to define a body region (which will be referred to herein as a "body region mask 50") is made on the drift layer 3 in the following manner. First of all, a masking material that can maintain its shape even at as high a temperature as 500° C. or more is deposited to a thickness of 1.5 µm or more on the drift layer 3 and then is subjected to photolithographic and dry etching processes, thereby cutting holes through the masking material only over portions to be body regions 4a. As the masking material, an oxide film, polysilicon, or a nitride film may be used, for example. Any other material may also be used unless that material is deformed at high temperatures. The thickness of the body region mask 50 depends on the ion implant energy but has only to be such a value at which the implanted species never penetrates the body region mask 50. Thereafter, as shown in FIG. 2(d), while maintaining the temperature of the substrate within the range of 400° C. to 600° C. in order to reduce implant defects, dopant ions 72 of the second conductivity type such as aluminum or boron are implanted into the drift layer 3. This process step is carried out by implanting the ions perpendicularly to the substrate 2 and the drift layer 3 as shown in FIG. 3(a). The body region 4a usually includes a dopant of the second conductivity type at a concentration of $1\times10^{17}$ $cm^{-3}$ to $1\times10^{18}$ $cm^{-3}$, and has its depth determined so as not to cause a punch-through. For example, by implanting Al into the drift layer 3 with an implant energy of 30 keV and at an implant dose of $5\times10^{11}$ $cm^{-3}$, with an acceleration voltage of 70 keV and at an implant dose of $1.5\times10^{12}$ $cm^{-3}$, and with an acceleration voltage of 20 keV and at an implant dose of $3\times10^{12}$ $m^3$, the concentration of the dopant introduced is set to be approximately $3\times10^{17}$ $cm^{-3}$ within a depth of 20 nm under the surface of the body region 3. Furthermore, to make the MISFET have a breakdown voltage of 1500 V or more, the dopant of the second conductivity type is implanted with an acceleration voltage of 500 keV and at an implant dose of $6\times10^{13}$ cm$^{-3}$ so that the dopant concentration will be $3\times10^{18}$ cm$^{-3}$ at a depth of 0.55 µm. In this manner, a body region 4a is defined in the drift layer 3.

Next, as shown in FIG. 2(e), ions 71 of a dopant of the first conductivity type are implanted obliquely, thereby defining a second doped region 7b of the first conductivity type in the drift layer 3 and under a part of the body region mask 50. In this process step, the implantation is preferably carried out with the temperature of the substrate maintained within the range of 400° C. to 600° C. in order to reduce implant defects. Also, in this process step, the dopant ions are implanted into the drift layer 3 from a direction that defines a predetermined tilt angle with respect to a normal to the substrate 2 within each of multiple planes that intersect at right angles with multiple sides that define the shape of the opening of the body region mask 50 (e.g., all four sides that define a square shape) as shown in FIG. 3(b). For example, nitrogen ions may be implanted as dopant ions at a dose of $10^{17}$ cm$^{-3}$ to $10^{18}$ cm$^{-3}$. The implant depth may be about 0.1 µm to about 0.3 µm. If the opening of the body region mask 50 has a square shape as shown in FIG. 3(b), then the implantation needs to be performed four times with the substrate 2 turned 90 degrees each time so that the second doped region 7b of the first conductivity type will be formed under the four sides of the body region mask 50 of the unit cell. As a result, the second doped region 7a of the first conductivity type is formed outside of the body region 4a except its corners as shown in FIG. 1(b). Meanwhile, if the body region mask 50 has an octagonal opening, then the implantation should be carried out eight times with the substrate 2 turned 45 degrees each time.

Figure 4:
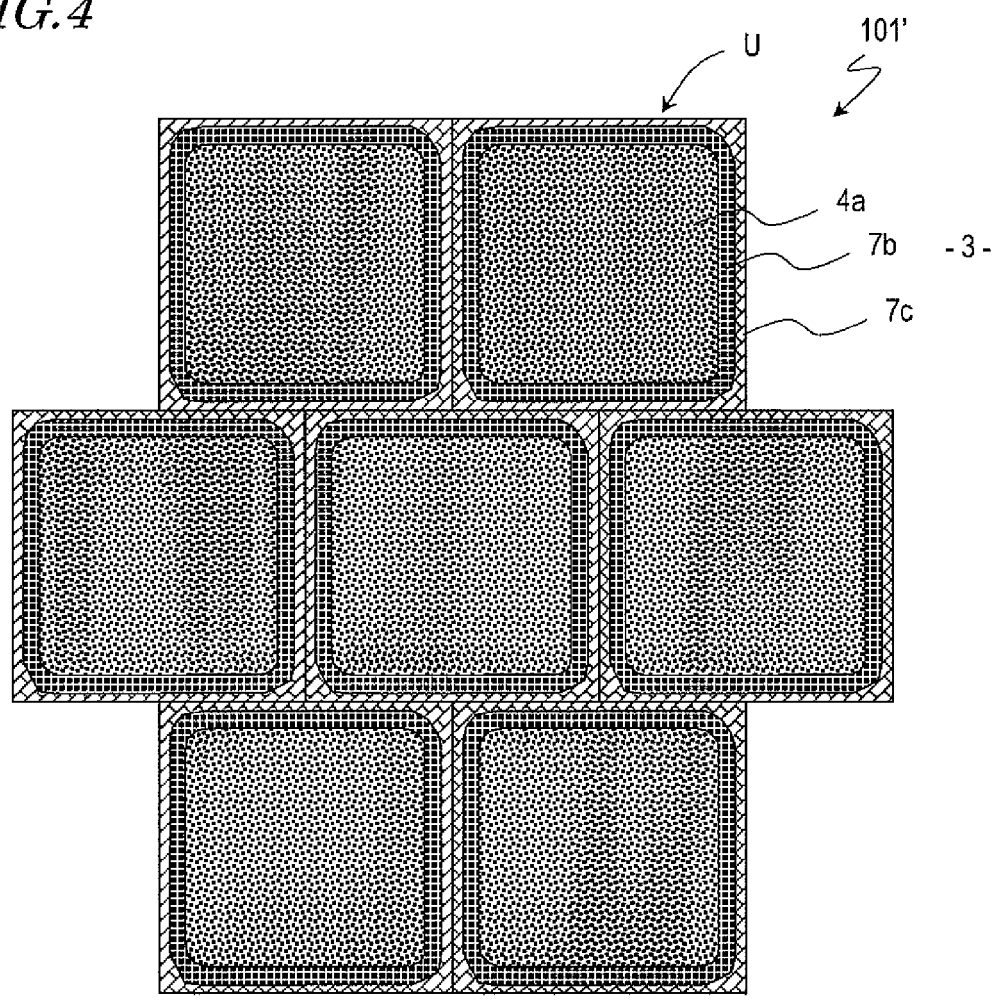
FIG. 4 is a plan view illustrating the arrangement and structure of unit cells in the drift layer.

Alternatively, ions of a dopant may also be implanted into the drift layer 3 from a direction that defines a tilt angle with respect to a normal to the substrate and the drift layer 3 with the substrate 2 rotated continuously on an axis that intersects with the substrate 2 at right angles as shown in FIG. 3(c). In that case, an MISFET 101', in which the second doped region 7b of the first conductivity type surrounds the body region 4a continuously as shown in FIG. 4, can be obtained.

As described above, it is preferred that the temperature of the substrate be kept high during the implantation process. However, depending on the method of heating the substrate, it may be difficult to continuously rotate the substrate while heating it at the same time. In that case, the substrate 2 may be rotated stepwise with ions of a dopant implanted into the drift layer 3 from a direction that defines a tilt angle with respect to a normal to the substrate 2 and the drift layer 3. More specifically, the substrate 2 is supported so that a normal to the substrate 2 is not parallel to the irradiation direction of dopant ions. And after ions of a dopant of the first conductivity type have been implanted into the drift layer 3 of the substrate 2, the substrate 2 is rotated θ (=360 degrees/n, where n is an integer that is equal to or greater than two) degrees on the normal as an axis of rotation. Thereafter, ions of the dopant of the first conductivity type are implanted again into the drift layer 3, and then the substrate 2 is rotated θ (=360 degrees/n, where n is an integer that is equal to or greater than two) degrees again on the normal as an axis of rotation. In this manner, the implantation is carried out n times in total and the substrate 2 is rotated (n−1) times, thereby defining the second doped region 7b of the first conductivity type in the drift layer 3 and under a part of the body region mask 50. If necessary, the implantation may also be carried out more than n times and the substrate may be rotated more than (n−1) times.

Subsequently, as shown in FIG. 2(f), ions 71 of a dopant of the first conductivity type are implanted perpendicularly to the drift layer 3, thereby defining a doped region, including portions to be the second doped region 7a and the first doped region 5 of the first conductivity type, in the drift layer 3. In this process step, by implanting nitrogen as the implant species with an implant energy of 30 keV and at a dose of $10^{11}$ cm$^{-2}$ to $10^{12}$ cm$^{-2}$, the threshold voltage can be controlled to the range of 3 V to 6 V. As the implant species, nitrogen may be replaced with phosphorus, antimony or any other dopant of the first conductivity type. In that case, the implantation process is preferably designed so that a similar dopant profile will be obtained compared to the case of implanting nitrogen ions.

By performing such a self-aligned ion implantation process using the body region mask 50 in order to control the threshold voltage in this manner, no implant species will be implanted into the third doped region 7c of the first conductivity type. As a result, while the MISFET is OFF, electric field will not be overconcentrated in the third doped region 7c of the first conductivity type to cause an increase in drain leakage current. And an increase in breakdown voltage can be minimized, too. Furthermore, increase in leakage current to flow through the gate insulating film or a breakdown of the gate insulating film due to an excessively high drain electric field can also be avoided and a decrease in threshold voltage can be checked, too.

Next, a mask to define a first doped region 5 of the first conductivity type is made in the following manner. First of all, as shown in FIG. 2(g), a masking material 52 is deposited all over the drift layer 3 and then subjected to a photolithographic process. In this process step, a resist mask 53 is made over a portion to turn into a contact region 4b in a subsequent process step. Then, as shown in FIG. 2(h), the masking material 52 is dry-etched through the resist mask 53, thereby cutting an opening only over a portion to be the first doped region 5 of the first conductivity type. In this process step, a sidewall is left on the side surfaces of the body region mask 50 by anisotropic etching, thereby defining the gate length by a self-aligning method. In this manner, a transistor, of which the channel length Lg is defined by as small a gate length as approximately 0.5 µm to 1 µm, can be fabricated.

Thereafter, the resist mask 53 is stripped as shown in FIG. 2(i) and ions 71 of a dopant of the first conductivity type are implanted into the drift layer 3 through the body region mask 50 and the masking material 52, thereby defining the first doped region 5 of the first conductivity type as shown in FIG. 2(j). The dopant concentration of the first doped region 5 of the first conductivity type is set to be within the range of $1\times10^{19}$ cm$^{-3}$ to $1\times10^{20}$ cm$^{-3}$ so that an ohmic contact is made when an electrode is formed.

Subsequently, the body region mask 50 and the masking material 52 are removed and another mask 53 to define a contact region 4b is made instead as shown in FIG. 2(k). Then, as shown in FIG. 2(l), ions 72 of a dopant of the second conductivity type are implanted into the drift layer 3 through the mask 53, thereby defining a contact region 4b of the second conductivity type, of which the dopant concentration is set to be about $1\times10^{20}$ cm$^{-3}$ so that an ohmic contact will be made when an electrode is formed. After this ion implantation is done, the mask 53 is removed.

After the mask 53 has been removed, an activation annealing process is carried out by keeping the substrate 2 heated to 1700° C. for 30 minutes within an inert gas such as argon gas in order to activate the dopant that has been introduced into the drift layer 3. As a result, micro steps with a height of approximately 10 to 100 nm are formed on the surface of the drift layer 3, thus increasing its surface roughness and decreasing its smoothness. That is why to avoid such a decrease in surface planarity, it is preferred that the heat treatment be carried out with the surface of the drift layer 3 covered with DLC (diamond-like carbon) or any other suitable material that can withstand heat. Then, the surface roughness should be reduced to approximately 1-10 nm.

When the activation annealing process is finished, DLC is removed. After that, an additional process for increasing the cleanliness on the substrate yet to be subjected to a gate oxidation process (e.g., a sacrificial oxidation process) is preferably carried out.

Figure 5:
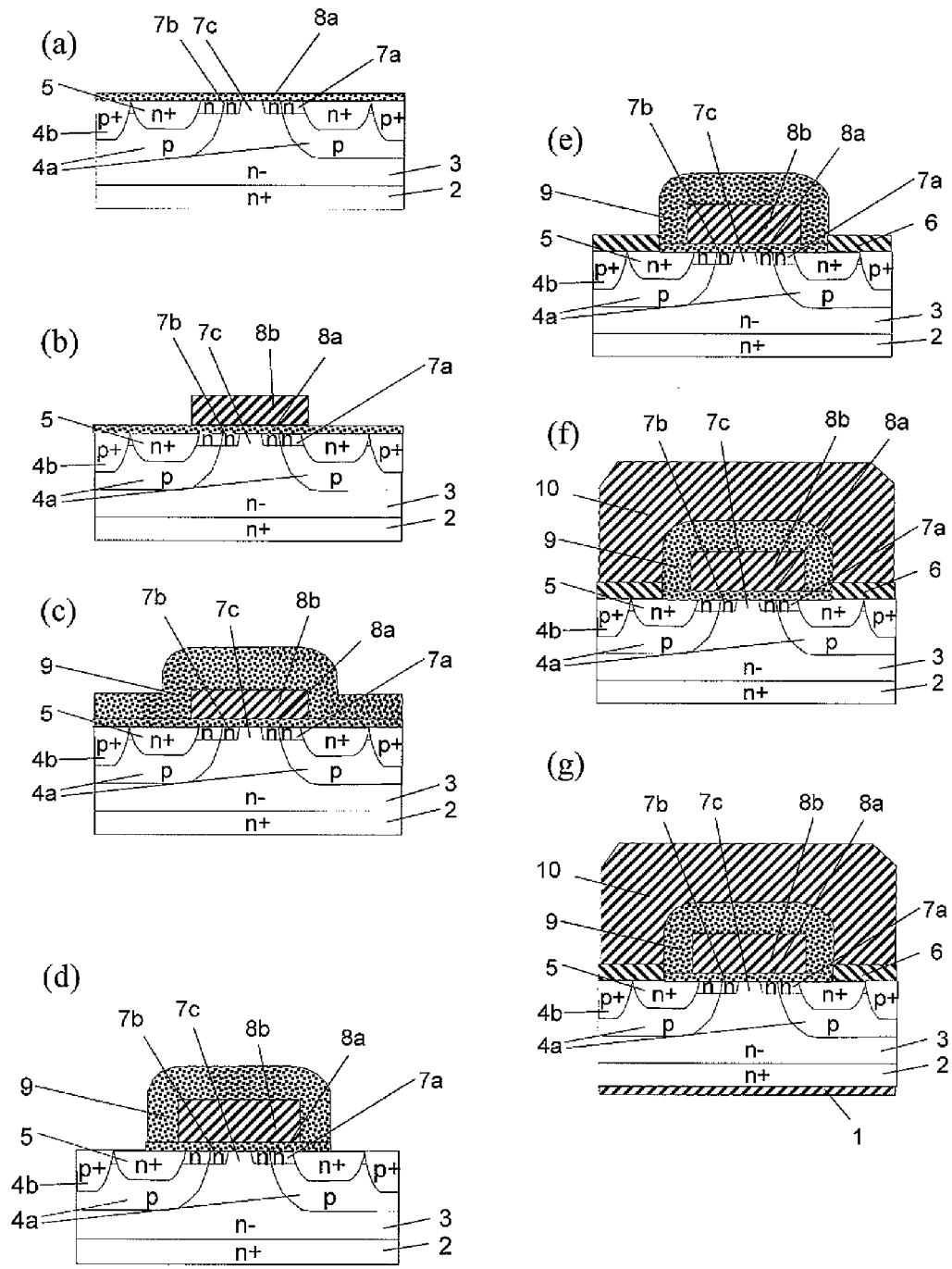
FIGS. 5(*a*) through 5(*g*) are cross-sectional views illustrating respective manufacturing processing steps to fabricate the semiconductor device shown in FIG. 1.

Next, as shown in FIG. 5(a), a cleaning process (such as an ordinary RCA cleaning process) is carried out before the gate oxidation process, thereby oxidizing the surface of the drift layer 3 and forming a gate insulating film 8a. In this process step, the gate insulating film 8a may be formed by the method disclosed in Japanese Patent Application Laid-Open Publication No. 2005-136386, for example. The thickness of the gate insulating film 8a is determined by the operating voltage of the gate driver. Considering the reliability of the gate insulating film 8a, if the gate insulating film 8a is made of $SiO_2$, it is a standard measure to take to design it with an electric field of about 3 MV/cm. Thus, if the gate operating voltage is 20 V, then the thickness of the gate insulating film 8a becomes approximately 70 nm.

Subsequently, as shown in FIG. 5(b), a gate electrode 8b is formed on the gate insulating film 8a. The gate electrode 8b may be formed by depositing and patterning a polysilicon film, which is heavily doped with a dopant of the first conductivity type (such as phosphorus or antimony). Alternatively, the polysilicon film may also be heavily doped with a dopant of the second conductivity type. Ordinarily, the gate electrode 8b is doped with phosphorus at a concentration of about $7 \times 10^{20}$ cm$^{-3}$. The gate electrode 8b may have a thickness of about 500 nm. Then, the gate electrode 8b thus formed is subjected to a PS oxidation process for activation purposes. A gate electrode with a high degree of reliability can be obtained by carrying out a heat treatment process at 900° C. in a dry oxygen atmosphere under such a condition that an oxide film will grow to a thickness of 50 nm to 100 nm.

Thereafter, an interlevel dielectric film 9 such as a PSG film is deposited as shown in FIG. 5(c) and contact holes are cut through it as shown in FIG. 5(d). As the interlevel dielectric film, an HTO film or an oxide film deposited by plasma CVD process may be used.

Subsequently, as shown in FIG. 5(e), a Ti or Ni film is deposited as a material for an ohmic electrode (source electrode) 6 and then patterned. After that, a heat treatment process is carried out at a temperature of approximately 900 to 1000° C. to make an ohmic contact. In this case, the contact resistance should be approximately $10^{-5}$ Ωcm$^2$ or less. Then, as shown in FIG. 5(f), an Al film is deposited and patterned, thereby forming a source line 10 connected to the ohmic electrode 6 of each unit cell. Finally, as shown in FIG. 5(g), a Ti or Ni film is deposited on the other surface of the substrate 2 opposite to the drift layer 3 (i.e., on the back surface) and then thermally treated at a temperature of approximately 900 to 1000° C., thereby forming another ohmic electrode (drain electrode) 1 there. In this manner, a double implanted MISFET is completed.

In the preferred embodiment described above, the third doped region 7c of the first conductivity type is supposed to have as high a dopant concentration as the drift layer 3. If the third doped region 7c of the first conductivity type should have a higher dopant concentration than the drift layer 3, however, the dopant concentration of the third doped region 7c of the first conductivity type should be determined so as to keep the reliability of the gate oxide film sufficiently high at the intermediate point between two adjacent body regions 4a of the second conductivity type while the MISFET is in OFF state and maintains the same drain voltage.

To make the dopant concentration of the third doped region 7c of the first conductivity type higher than that of the drift layer 3, after the drift layer 3 has been formed on the SiC substrate 2 as shown in FIG. 2(b), an n-type doped layer that is as thick as the third doped region 7c of the first conductivity type may be formed near the surface of the drift layer 3 by performing an ion implantation process. Alternatively, while the drift layer 3 is being grown, the dopant concentration may be increased around the end of the growth period to form an n-type doped layer that is as thick as the third doped region 7c of the first conductivity type near the surface of the drift layer 3.

(Embodiment 2)

Figure 6:
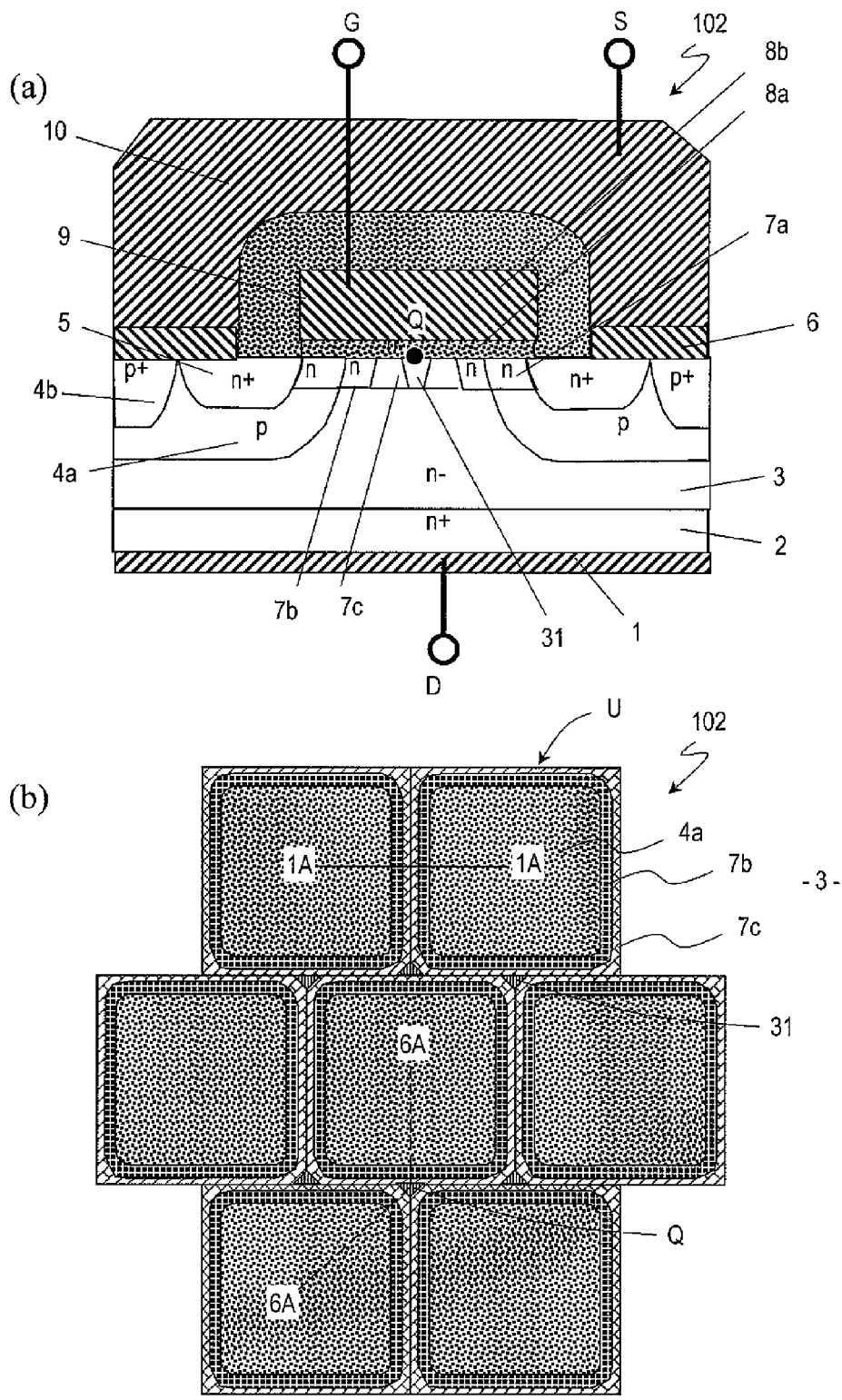
FIG. 6 illustrates a second specific preferred embodiment of a semiconductor device according to the present invention, wherein FIG. 6(*a*) is a cross-sectional view thereof, and FIG. 6(*b*) is a plan view illustrating the arrangement and structure of unit cells in the drift layer.

Hereinafter, a second preferred embodiment of a semiconductor device according to the present invention will be described. FIG. 6(a) illustrates a cross-sectional structure of a portion of a double-implanted MISFET 102, while FIG. 6(b) is a plan view of the MISFET 102 as viewed from over its drift layer 3. The cross-sectional structure as viewed on the plane 1A-1A shown in FIG. 6(b) is the same as that of the first preferred embodiment. As in the first preferred embodiment described above, the MISFET 102 also has a number of unit cells U, which are arranged in a hound's-tooth check pattern on the drift layer 3 and each of which has a square shape.

As shown in FIGS. 6(a) and 6(b), the MISFET 102 further has a fourth doped region 31 of the first conductivity type, which is arranged adjacent to the third doped region 7c of the first conductivity type in the drift layer 3 and includes a vertex of a unit cell U, which is a difference from the first preferred embodiment described above. The dopant concentration of the fourth doped region 31 of the first conductivity type is set to be lower than that of the third doped region 7c of the first conductivity type, and may be set to be equal to or higher than that of the drift layer 3.

As shown in FIG. 6(b), the distance between the respective body regions 4a of two adjacent unit cells U is longer as measured along the 1 line 6A-6A that passes a vertex of one of the two unit cells U than as measured along the line 1A-1A that is drawn across the two contacting sides of the two adjacent unit cells U. That is why even if the dopant concentration of the third doped region 7c of the first conductivity type is set so as to deplete the drift layer 3 completely where those two sides of the two adjacent unit cells U are in contact with each other while the MISFET 102 is in OFF state and a drain voltage is applied thereto, the depletion layer expanding from the body regions 4a does not reach the vicinity of a point Q, which is located at a vertex of the unit cell U. For that reason, the electric field could be overconcentrated at that point Q.

Thus, to avoid such a situation, the dopant concentration of the fourth doped region 31 of the first conductivity type is set according to this preferred embodiment to be lower than that of the third doped region 7c of the first conductivity type. Then, even in such a situation where there is a longer distance between the respective body regions 4a of two adjacent unit cells U as measured along the 1 line 6A-6A that passes a vertex of one of the two unit cells U, if the drift layer 3 gets depleted where those two sides of adjacent unit cells U are in contact with each other, the drift layer 3 can also get depleted in the vicinity of the point Q, which is located at one of the vertices of one unit cell U. As a result, while the MISFET 102 is in OFF state and a drain voltage is applied thereto, such an overconcentration of an electric field toward the point Q can be reduced significantly. Consequently, the drain leakage current to flow in OFF state can be minimized and a decrease in breakdown voltage can be checked. What is more, an increase in leakage current to flow through the gate insulating film or a breakdown of the gate insulating film due to an excessively high drain electric field can also be avoided and a decrease in threshold voltage can be checked as well.

This MISFET 102 can be fabricated in the same way as the MISFET 101 of the first preferred embodiment described above except how to form the fourth doped region 31 of the first conductivity type.

First of all, in the same way as in the process of fabricating the MISFET 101, a drift layer 3 is formed on the substrate 2 as shown in FIG. 2(b).

If the dopant concentration of the fourth doped region 31 of the first conductivity type is set to be as high as that of the drift layer 3, a mask to define the third doped region 7c of the first conductivity type is made on the drift layer 3 and ions of a dopant of the first conductivity type are implanted into the drift layer 3 through the mask, thereby defining the third doped region 7c of the first conductivity type. As a result, the fourth doped region 31 of the first conductivity type is fixed in the drift layer 3 so as to be located at a vertex of the unit cell U when viewed from over the surface 3a of the drift layer 3.

On the other hand, if the dopant concentration of the fourth doped region 31 of the first conductivity type is set to be higher than that of the drift layer 3, then a mask that defines a region that covers both of the third and fourth doped regions 7c and 31 of the first conductivity type is made on the drift layer 3 and ions of a dopant of the first conductivity type are implanted into the drift layer 3 through that mask. After that, the mask is removed, a mask that defines only the third doped region 7c of the first conductivity type is made on the drift layer 3, and ions of a dopant of the first conductivity type are implanted into the drift layer 3 through that mask. As a result, the fourth doped region 31 of the first conductivity type, which includes the dopant of the first conductivity type at a higher concentration than the drift layer 3, and the third doped region 7c of the first conductivity type, which is more heavily doped with the dopant of the first conductivity type than the fourth doped region 31 of the first conductivity type, are formed in the drift layer 3. After that, the MISFET 102 can be fabricated by performing the same procedure as the MISFET 101 of the first preferred embodiment described above.

Optionally, the manufacturing process of the MISFET 101 may also be modified so that after the contact layer 4b has been defined in the body region 4a as shown in FIG. 2(l), the third and fourth doped regions 7c and 31 of the first conductivity type may be defined in the drift layer 3 as described above.

EXPERIMENTAL EXAMPLES

The present inventors carried out experiments to examine how a variation in the dopant concentrations of the second doped region 7b of the first conductivity type and the body region 4a would affect the channel resistance of the MISFET 101 of the first preferred embodiment. The results are as follows.

Figure 7:
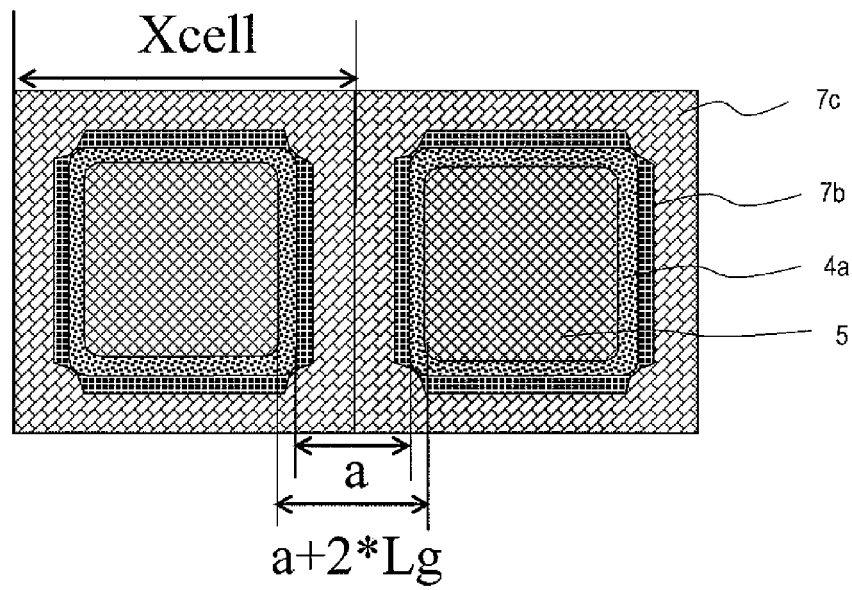
FIG. 7 is a plan view illustrating the sizes of two adjacent unit cells.

Suppose the size of each unit cell is indicated by Xcell and the interval between the respective first n-type doped regions 5 of two adjacent unit cells and the interval between the respective second n-type doped regions 7a thereof as measured in the direction in which the unit cells are arranged are indicated by a+2Lg and a, respectively, as shown in FIG. 7. The width of the second n-type doped region 7a as measured in the direction in which the unit cells are arranged is indicated by Lg representing the channel length. The numerical values that were used to make a calculation are shown in the following Table 1:

TABLE 1

| Item | Sign | Unit | Value |
| --- | --- | --- | --- |
| Unit cell size | Xcell | μm | 9.6 |
| Interval between body regions 4a | a | μm | 3 |
| Interval between first doped regions 5 of first conductivity type | a + 2Lg | μm | 4 |
| Dopant concentration of body region 4a | Na | $cm^{-3}$ | — |
| Dopant concentration of second doped region 7b of first conductivity type | $N_{ext}$ | $cm^{-3}$ | — |

Figure 8:
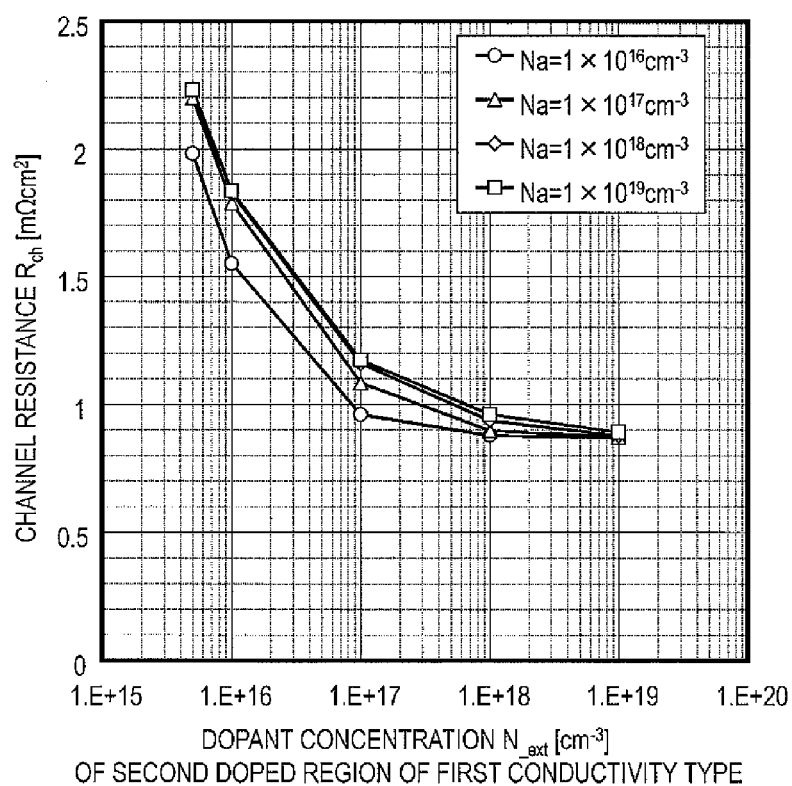
FIG. 8 is a graph showing how the channel resistance changes with the dopant concentration in the second doped region of the first conductivity type.
Figure 9:
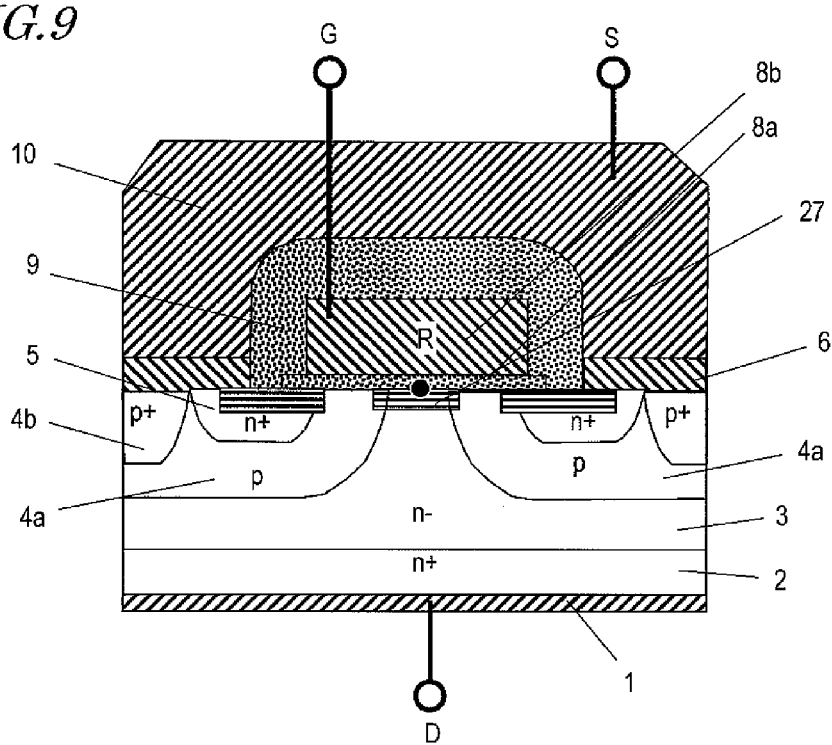
FIG. 9 is a cross-sectional view illustrating the structure of a conventional semiconductor device.

FIG. 8 shows how the channel resistance Rch [$m\Omega cm^2$] calculated changed with the dopant concentration Na of the body region 4a and the dopant concentration $N_{ext}$ of the second doped region 7b of the first conductivity type. In this case, the channel resistance Rch was calculated with an effective channel mobility supposed to be 39.3 $cm^2/Vs$. This is a value calculated with respect to a channel with a gate insulating film that was obtained by nitrifying a silicon dioxide film that had been formed by oxidizing the surface of the drift layer. The same effect would also be achieved even by adopting an effective channel mobility that has been obtained from any other insulating film. The MISFET 101 had a threshold value of 7 V and the channel resistance Rch was calculated with a voltage of 20 V applied to the gate. The operating temperature was set to be 20° C.

As can be seen from FIG. 8, irrespective of the dopant concentration of the body region 4a, the higher the dopant concentration of the second doped region of the first conductivity type, the lower the channel resistance Rch. The channel resistance Rch eventually converged to 0.9 $m\Omega cm^2$, which was a channel resistance value associated with the original channel length Lg (=0.5 μm) that had not extended yet due to the generation of the depletion layer.

On the other hand, if the dopant concentration $N_{ext}$ of the second doped region 7b of the first conductivity type was approximately as high as that of the drift layer 3 (i.e., within the range of $5 \times 10^{15}$ $cm^{-3}$ to $1 \times 10^{16}$ $cm^{-3}$) and if the dopant concentration Na of the body region 4a was $1 \times 10^{17}$ $cm^{-3}$ or more, then the channel resistance Rch was 1.8 $m\Omega cm^2$ or more, which is more than twice as high as the original channel resistance.

Consequently, it can be seen that to reduce the channel resistance significantly, the dopant concentration of the second doped region 7b of the first conductivity type is preferably set to be equal to or higher than $1 \times 10^{16}$ $cm^{-3}$.

From the standpoint of channel resistance reduction, the higher the dopant concentration $N_{ext}$ of the second doped region 7b of the first conductivity type, the better. However, if the dopant concentration $N_{ext}$ were set to be equal to or higher than $10^{18}$ $cm^{-3}$, the application of a high voltage to the drain would apply a high electric field to the second doped region 7b of the first conductivity type. That would backfire on the OFF-state characteristic of the device and would cause a decrease in breakdown voltage and an increase in the amount of leakage current to flow. Also, the lower the electric field intensity of the gate oxide film at the point P shown in FIG. 1 at which the electric field becomes the highest in OFF state, it is more preferred to set the dopant concentration $N_{ext}$ of the second doped region 7b of the first conductivity type to be $10^{17}$ $cm^{-3}$ or less. As can be seen from FIG. 8, even if the dopant concentration $N_{ext}$ was set to be within the range of about $10^{17}$ $cm^{-3}$ to about $10^{18}$ $cm^{-3}$, the channel resistance did not increase so much. Consequently, it can be seen that the OFF state characteristic of the MISFET can be improved according to the present invention with the channel resistance reduced, although it has been widely believed difficult in the art to achieve these two objects at the same time.

Next, a preferred width of the depletion layer that expands from the body region 4a toward the second doped region 7b of the first conductivity type and a preferred width of the second doped region 7b of the first conductivity type as measured in the direction in which adjacent cells are arranged will be described. The following Tables 2 and 3 show results of calculations indicating how the width of the depletion layer expanding toward the second doped region 7b the first conductivity type changed with the dopant concentration $N_{ext}$ of the second doped region 7b of the first conductivity type in two typical preferred embodiments of the present invention in which the concentrations Na of the body region 4a were $1\times10^{17}$ cm$^{-3}$ and $1\times10^{18}$ cm$^{-3}$, respectively:

TABLE 2

| $N_{ext}$ (cm$^{-3}$) | Depletion layer's width (μm) |
|---|---|
| $1 \times 10^{16}$ | 0.62 |
| $1 \times 10^{17}$ | 0.15 |
| $1 \times 10^{18}$ | 0.019 |
| $1 \times 10^{19}$ | 0.0021 |

TABLE 3

| $N_{ext}$ (cm$^{-3}$) | Depletion layer's width (μm) |
|---|---|
| $1 \times 10^{16}$ | 0.65 |
| $1 \times 10^{17}$ | 0.20 |
| $1 \times 10^{18}$ | 0.036 |
| $1 \times 10^{19}$ | 0.0062 |

If the width of the second doped region 7b of the first conductivity type as measured in the direction in which adjacent cells are arranged (i.e., the length as measured from the end of the body region 4a) is equal to or greater than the width of the depletion layer, then the second doped region 7b of the first conductivity type contributes effectively to reducing the channel resistance. As shown in Tables 2 and 3, no matter whether the dopant concentration Na of the body region 4a is $1\times10^{17}$ cm$^{-3}$ or $1\times10^{18}$ cm$^{-3}$, if the second doped region 7b of the first conductivity type has a dopant concentration $N_{ext}$ of $1\times10^{16}$ cm$^{-3}$, then the depletion layer expanding in the second doped region 7b of the first conductivity type will have a width of 0.6 μm or more. Consequently, if the channel length Lg is 0.5 μm, the overall channel resistance will be twice or more as high as the original channel resistance. This result agrees exactly with the one shown in FIG. 8. Specifically, as shown in FIG. 8, if the body region 4a has a dopant concentration Na of either $1\times10^{17}$ cm$^{-3}$ or $1\times10^{18}$ cm$^{-3}$ and if the second doped region 7b of the first conductivity type has a dopant concentration $N_{ext}$ of $1\times10^{16}$ cm$^{-3}$, then the channel resistance Rch becomes 1.8 mΩcm$^2$ or more, which is twice or more as high as the original channel resistance.

The body region 4a and the second doped region 7b of the first conductivity type are not always in contact with each other. However, even if these two regions 4a and 7b are out of contact with each other, the width of the depletion layer expanding in the second doped region 7b of the first conductivity type from the body region 4a is also determined by the dopant concentration $N_{ext}$ of the second doped region 7b of the first conductivity type and the relations shown in Table 3 are also satisfied. That is why when the semiconductor device is designed, the dopant concentration of the second doped region 7b of the first conductivity type is preferably set to be so high that the width of the second doped region 7b of the first conductivity type as measured in the direction in which adjacent cells are arranged is at least roughly large enough to deplete the second doped region of the first conductivity type from the body region 4a but shorter than the channel length.

As can be seen from Tables 2 and 3, the higher the dopant concentration of the second doped region 7b of the first conductivity type, the shorter the width of the depletion layer. It can also be seen that by providing a second doped region 7b of the first conductivity type, which the width is approximately equal to or greater than that of the depletion layer, the channel resistance can be reduced. For example, if the body region 4a has a dopant concentration Na of $1\times10^{17}$ cm$^{-3}$ and if the second doped region 7b of the first conductivity type has a dopant concentration $N_{ext}$ of $1\times10^{19}$ cm$^{-3}$, then the depletion layer expanding in the second doped region 7b of the first conductivity type will have a width of approximately 0.02 μm. As described above, if the dopant concentration $N_{ext}$ of the second doped region 7b of the first conductivity type is high, then the OFF-state characteristic of the semiconductor device could be affected adversely. For that reason, the width of the second doped region 7b of the first conductivity type should not be increased more than necessarily. In other words, the width of the second doped region 7b of the first conductivity type is preferably approximately equal to the width of the depletion layer expanding in the second doped region 7b of the first conductivity type. In that case, however, it is difficult in fact to set the width of the second doped region 7b of the first conductivity type to be approximately 0.002 μm.

In view of these considerations, when formed by ion implantation, the second doped region 7b of the first conductivity type should have a width of 0.01 μm to 0.1 μm. In that case, the second doped region 7b of the first conductivity type preferably has a dopant concentration $N_{ext}$ of $1\times10^{17}$ cm$^{-3}$ to $1\times10^{18}$ cm$^{-3}$.

Also, if the second doped region 7b of the first conductivity type has a high concentration, an electric field with a significantly high intensity will be generated at the pn junction between the second doped region 7b of the first conductivity type and the body region 4b, thus possibly decreasing the reliability of the semiconductor device. To avoid such a situation, the second doped region 7b of the first conductivity type preferably has a dopant concentration of $1\times10^{16}$ cm$^{-3}$ to $1\times10^{18}$ cm$^{-3}$, and more preferably has a dopant concentration of $1\times10^{16}$ cm$^{-3}$ to $1\times10^{17}$ cm$^{-3}$.

Consequently, the dopant concentration of the second doped region 7b of the first conductivity type is preferably $1\times10^{16}$ cm$^{-3}$ to $1\times10^{19}$ cm$^{-3}$, more preferably $1\times10^{16}$ cm$^{-3}$ to $1\times10^{18}$ cm$^{-3}$, and even more preferably $1\times10^{16}$ cm$^{-3}$ to $1\times10^{17}$ cm$^{-3}$.

Industrial Applicability

The present invention can be used effectively in a power MISFET and in various controllers and drivers that uses a power MISFET.

Reference Signs List

| 1 | ohmic electrode |
|---|---|
| 2 | substrate |
| 3 | drift layer |
| 3d | depletion layer that runs through the drift layer |
| 4a | body region |
| 4b | contact layer |
| 5 | first doped region of first conductivity type |

-continued

| 6 | ohmic electrode |
|---|---|
| 7a | channel region |
| 7b | second doped region of first conductivity type |
| 7c | third doped region of first conductivity type |
| 8a | gate insulating film |
| 8b | gate electrode |
| 9 | interlevel dielectric film |
| 10 | source line |
| 31 | fourth doped region of first conductivity type |
| 50 | mask to define body region |
| 52, 53 | mask |

The invention claimed is:

1. A semiconductor device comprising a plurality of unit cells that are arranged either one-dimensionally or multi-dimensionally, each said unit cell comprising:
a substrate, which is made of a wide-bandgap semiconductor of a first conductivity type;
a drift layer, which is arranged on the substrate and which is made of the wide-bandgap semiconductor of the first conductivity type;
a body region of a second conductivity type, which is defined in the drift layer;
a first doped region of the first conductivity type, which is defined in the body region;
a second doped region of the first conductivity type, which is arranged adjacent to the body region and defined in a surface region of the drift layer;
a third doped region of the first conductivity type, which is arranged between the second doped region of the first conductivity type and an adjacent unit cell's second doped region of the first conductivity type and defined in the surface region of the drift layer so as to be in contact with the second doped region of the first conductivity type;
a fourth doped region of the first conductivity type, which is defined in the drift layer adjacent to the third doped region of the first conductivity type and includes a vertex of the unit cell when viewed from over the surface of the drift layer;
a gate insulating film, which is arranged so as to contact with the surface of the drift layer at least between the first and second doped regions of the first conductivity type;
a gate electrode, which is arranged on the gate insulating film;
a first ohmic electrode, which is electrically connected to the first doped region of the first conductivity type; and
a second ohmic electrode, which is electrically connected to the other surface of the substrate that is opposite to its surface with the drift layer,
wherein the dopant concentration of the third doped region of the first conductivity type is lower than that of the second doped region of the first conductivity type and equal to or higher than that of the drift layer, and
wherein the dopant concentration of the fourth doped region of the first conductivity type is lower than that of the third doped region of the first conductivity type, and
wherein the fourth doped region of the first conductivity type is not provided where two sides of two adjacent unit cells are in contact with each other.

2. The semiconductor device of claim 1, further comprising a channel region of the first conductivity type, which is arranged in a surface region of the body region so as to reach both of the first doped region of the first conductivity type and the drift layer and to contact with the gate insulating film, wherein the dopant concentration of the channel region is between the respective dopant concentrations of the first and second doped regions of the first conductivity type.

3. The semiconductor device of claim 2, wherein the thickness of the second doped region of the first conductivity type is equal to or smaller than that of the channel region.

4. The semiconductor device of claim 1, wherein when each said unit cell is viewed from over the surface of the drift layer, the width of the second doped region of the first conductivity type as measured in a direction in which the unit cells are arranged is at least roughly large enough to deplete the second doped region of the first conductivity type from the body region.

5. The semiconductor device of claim 1, wherein when each said unit cell is viewed from over the surface of the drift layer, the body region has a square shape and the second doped region of the first conductivity type is not provided at any of the four corners of the body region.

6. The semiconductor device of claim 1, wherein when each said unit cell is viewed from over the surface of the drift layer, the second doped region of the first conductivity type surrounds the body region continuously.

7. The semiconductor device of claim 1, wherein the dopant concentration of the second doped region of the first conductivity type is higher than that of the body region.

8. The semiconductor device of claim 7, wherein the second doped region of the first conductivity type has a dopant concentration of $1\times10^{16}$ cm$^{-3}$ to $1\times10^{19}$ cm$^{-3}$.

9. The semiconductor device of claim 7, wherein the second doped region of the first conductivity type has a dopant concentration of $1\times10^{16}$ cm$^{-3}$ to $1\times10^{18}$ cm$^{-3}$.

10. The semiconductor device of claim 7, wherein the second doped region of the first conductivity type has a dopant concentration of $1\times10^{16}$ cm$^{-3}$ to $1\times10^{17}$ cm$^{-3}$.

11. The semiconductor device of claim 7, wherein the second doped region of the first conductivity type has a width of 0.01 μm to 0.1 μm and has a dopant concentration of $1\times10^{17}$ cm$^{-3}$ to $1\times10^{18}$ cm$^{-3}$.

12. A method for fabricating the semiconductor device of claim 1, the method comprising the steps of:
(A) providing a substrate of a wide-bandgap semiconductor of a first conductivity type, in which a drift layer of the wide-bandgap semiconductor of the first conductivity type has been defined;
(B) making a body region mask on the drift layer;
(C) implanting a dopant of a second conductivity type through the body region mask, thereby defining a body region of the second conductivity type in the drift layer;
(D) implanting a dopant of the first conductivity type both in a perpendicular direction to the substrate and in a direction oblique to the perpendicular direction through the body region mask, thereby defining a doped region, including a channel region, in the drift layer and also defining a second doped region of the first conductivity type in a portion of the drift layer under the body region mask;
(E) making another mask to define a first doped region of the first conductivity type on the drift layer, said another mask being self-aligned with the body region mask;
(F) implanting a dopant of the first conductivity type through said another mask, thereby defining the first doped region of the first conductivity type in the drift layer and defining the channel region;
(G) removing the body region mask and said another mask;
(H) subjecting the drift layer to an activating annealing process;

(I) forming a gate insulating film on the surface of the first and second doped regions of the first conductivity type;

(J) forming a gate electrode on the gate insulating film; and (K) forming an ohmic electrode that contacts with the first doped region of the first conductivity type and another ohmic electrode that contacts with the other surface of the substrate opposite to its surface with the drift layer.

13. The method of claim 12, wherein the step (D) includes the steps of implanting the dopant of the first conductivity type into the drift layer from a direction that defines a predetermined tilt angle with respect to a normal to the surface of the substrate on each of multiple planes that intersect at right angles with multiple sides that define an opening of the body region mask, thereby defining the second doped region of the first conductivity type in that portion of the drift layer under the body region mask, and implanting the dopant of the first conductivity type perpendicularly to the substrate, thereby defining the doped region, including the channel region, in the drift layer.

14. The method of claim 12, wherein the step (D) includes the steps of implanting the dopant of the first conductivity type into the drift layer from a direction that defines a predetermined tilt angle with respect to a normal to the surface of the substrate while rotating the substrate continuously on an axis that intersects with the substrate at right angles, thereby defining the second doped region of the first conductivity type in that portion of the drift layer under the body region mask, and implanting the dopant of the first conductivity type both perpendicularly and obliquely to the substrate, thereby defining the doped region, including the channel region, in the drift layer.

* * * * *